United States Patent
Suzawa

(10) Patent No.: US 6,414,345 B1
(45) Date of Patent: *Jul. 2, 2002

(54) SEMICONDUCTOR DEVICE INCLUDING ACTIVE MATRIX CIRCUIT

(75) Inventor: Hideomi Suzawa, Kanagawa (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/165,150

(22) Filed: Oct. 2, 1998

Related U.S. Application Data

(62) Division of application No. 08/961,807, filed on Oct. 31, 1997, now Pat. No. 5,856,689, which is a division of application No. 08/807,001, filed on Mar. 10, 1997, now Pat. No. 5,712,495, which is a continuation of application No. 08/471,101, filed on Jun. 6, 1995, now abandoned.

(30) Foreign Application Priority Data

Jun. 13, 1994 (JP) ............................................. 6-154177

(51) Int. Cl.$^7$ ..................... H01L 27/108; H01L 29/76; H01L 29/94; H01L 31/119
(52) U.S. Cl. ....................... 257/296; 257/350; 257/351; 257/379
(58) Field of Search .............................. 257/59, 71, 72, 257/296, 369, 379, 350, 351

(56) References Cited

U.S. PATENT DOCUMENTS

| | | | |
|---|---|---|---|
| 3,859,716 A | 1/1975 | Tihanyi | 29/571 |
| 4,757,026 A | 7/1988 | Woo et al. | 437/29 |
| 4,876,213 A | 10/1989 | Pfiester | 437/34 |
| 5,182,620 A * | 1/1993 | Shimada et al. | 257/72 |
| 5,266,823 A | 11/1993 | Noji et al. | 257/327 |
| 5,323,042 A | 6/1994 | Matsumoto | 257/350 |
| 5,359,219 A | 10/1994 | Hwang | 257/351 |
| 5,396,084 A | 3/1995 | Matsumoto | 257/72 |
| 5,403,762 A | 4/1995 | Takemura | |
| 5,412,240 A | 5/1995 | Inoue et al. | 257/347 |
| 5,412,493 A | 5/1995 | Kunii et al. | 359/59 |
| 5,473,184 A | 12/1995 | Murai | 257/382 |
| 5,495,121 A | 2/1996 | Yamazaki et al. | 257/384 |
| 5,514,879 A | 5/1996 | Yamazaki | 257/65 |
| 5,572,046 A | 11/1996 | Takemura | |
| 5,576,857 A | 11/1996 | Takemura | |
| 5,620,905 A * | 4/1997 | Konuma et al. | 438/163 |
| 5,650,636 A | 7/1997 | Takemura et al. | 257/59 |
| 5,712,495 A | 1/1998 | Sugawa | 257/59 |
| 5,739,549 A | 4/1998 | Takemura et al. | 257/59 |
| 5,767,930 A * | 6/1998 | Kobayashi et al. | |
| 5,856,689 A * | 1/1999 | Suzawa | |

FOREIGN PATENT DOCUMENTS

| | | |
|---|---|---|
| JP | 06-095157 | 7/1981 |
| JP | 58-093092 | 6/1983 |
| JP | 63-121886 | 5/1988 |
| JP | 64-081262 | 3/1989 |
| JP | 01-274116 | 11/1989 |

(List continued on next page.)

Primary Examiner—Ngân V. Ngô
(74) Attorney, Agent, or Firm—Eric J. Robinson; Nixon Peabody LLP

(57) ABSTRACT

There is provided a combination of doping process and use of side walls which allows the source and drain of a thin film transistor of an active matrix circuit to be doped with only one of N-type and P-type impurities and which allows the source and drain of a thin film transistor used in a peripheral circuit of the same conductivity type as that of the thin film transistor of the active matrix circuit to include both of N-type and P-type impurities. Also, a thin film transistor in an active matrix circuit has offset regions by using side walls, and another thin film transistor in a peripheral circuit has a lightly doped region by using side walls.

96 Claims, 5 Drawing Sheets

FOREIGN PATENT DOCUMENTS

| | | |
|---|---|---|
| JP | 01-289917 | 11/1989 |
| JP | 02-224284 | 9/1990 |
| JP | 05-267667 | 8/1991 |
| JP | 03-274029 | 12/1991 |
| JP | 04-170067 | 6/1992 |
| JP | 04-195123 | 7/1992 |
| JP | 04-344618 | 12/1992 |
| JP | 05-027258 | 2/1993 |
| JP | 05-034718 | 2/1993 |
| JP | 06-250212 | 2/1993 |
| JP | 05-061057 | 3/1993 |
| JP | 05-297411 | 11/1993 |
| JP | 06-035004 | 2/1994 |
| JP | 06-077252 | 3/1994 |
| JP | 06-095147 | 4/1994 |
| JP | 06-097441 | 4/1994 |
| JP | 06-102531 | 4/1994 |
| JP | 07-335903 | 6/1994 |

* cited by examiner

SEMICONDUCTOR DEVICE INCLUDING ACTIVE MATRIX CIRCUIT

This application is a divisional application of Application Ser. No. 08/961,807, filed Oct. 31, 1997, now U.S. Pat. No. 5,856,689 which is a divisional application of Application Ser. No. 08/807,001, filed Mar. 10, 1997, now U.S. Pat. No. 5,712,495, which itself is a continuation of Application Ser. No. 08/471,101, filed Jun. 6, 1995, now abandoned.

BACKGROUND OF THE INVENTION

1. Field of the Invention

The present invention relates to an active matrix circuit fabricated using thin film insulated gate type semiconductor devices (thin film transistors or TFTs) formed on an insulating substrate (in this specification, the "insulating substrate" generally means a material having an insulating surface and, unless otherwise defined, it implies not only an insulating material such as glass but also a material such as a semiconductor or metal having an insulator layer formed thereon). More particularly, the present invention relates to a monolithic active matrix circuit which includes peripheral circuits for driving it formed on the same substrate. A monolithic active matrix circuit according to the present invention is suitable for matrix type displays such as liquid crystal displays and plasma displays.

2. Description of the Related Art

As shown in FIG. 5, a monolithic active matrix circuit is comprised of an active matrix circuit area, a source driver, and a gate driver which are formed using substantially the same process. In an active matrix circuit, TFTs are used as switching elements for liquid crystal cells. In order to supplement the electrostatic capacity of the liquid crystal cells, auxiliary capacities are provided in parallel with the liquid crystal cells. The peripheral circuits such as the source driver and gate driver are constituted by a shift register and switching elements which must be capable of operating at high speed. Taking this into consideration, monolithic active matrix circuits are constructed using a crystalline semiconductor (e.g., polycrystalline silicon). Further, in order to suppress power consumption, the peripheral circuits are constructed using complementary circuits (CMOS). Such techniques are described in Japanese unexamined patent publication (KOKAI) No. H1-289917 in which switching TFTs in an active matrix circuit and a TFT that constitutes a shift register of a peripheral circuit are described as having substantially the same sectional structure.

However, TFTs as the switching elements in an active matrix circuit and TFTs in CMOS circuits such as a shift register do not operate in the same way. For example, for a TFT as a switching element, a high reverse bias voltage (a negative voltage if the TFT is of the N-channel type) is applied to the gate electrode. On the other hand, principally, no reverse bias voltage is applied to a TFT in a CMOS logic circuit. Further, the operating speed of the former may be one percent or less of the speed required for the latter.

As described above, it has been considered undesirable to employ the same structure to build TFTs for which operating conditions and required characteristics are greatly different.

SUMMARY OF THE INVENTION

It is an object of the present invention to optimize an active matrix circuit and peripheral circuits thereof by differentiating the structure of TFTs as the switching elements used in the active matrix circuit from that of TFTs used for CMOS logic circuits such as shift registers of the peripheral circuits.

Specifically, the source and drain of a TFT of an active matrix circuit are substantially doped with only one of two types of impurities, i.e., N-type and P-type impurities, whereas the source and drain of a TFT of a peripheral circuit which is of the same conductivity type as the TFT of the active matrix circuit are doped with both of N-type and P-type impurities.

If a TFT of the active matrix circuit is of the P-channel type, the source and drain thereof are doped with only P-type impurities. On the other hand, the source and drain of a P-channel type TFT of a peripheral circuit are doped with both of P-type and N-type impurities. Needless to say, in general, the density of P-type impurities is higher than that of N-type impurities.

The present invention is characterized in that the structure of a TFT is optimized using side walls formed on both sides of the gate electrode and a gate line thereof.

The side walls according to the present invention are formed by coating the gate electrode and gate line with an insulator film and by etching the film on an anisotropic basis. The substantially triangular insulators (side walls) formed on both sides of the gate electrode and gate line are used as masks during doping to form a low density drain (lightly doped drain, LDD) structure, an offset gate structure, and the like.

A process of providing an LDD through the formation of such side walls will be described with reference to FIG. 1. First, a crystalline semiconductor region 103 in the form of an island is formed on a substrate 101. An insulated base film 102 may be formed on the substrate. After depositing a gate insulation film 104, a gate electrode 105 and a gate line 106 are formed using appropriate materials. As the materials for the gate electrode and gate line, materials which can be anodized, e.g., aluminum, may be used. (See FIG. 1A)

Thereafter, the semiconductor region is irradiated by accelerated ions of the doping impurities to form an impurity region 109 with the gate electrode 105 serving as a mask. If phosphorous is used as the doping impurities, an N-type impurity region is obtained and, if boron is used, a P-type impurity region is obtained. The conductivity of the impurities can be controlled by adjusting the densities and mixing ratio of those impurities. The amount of doping (dose) must be kept small in order to obtain an LDD structure. If no doping is performed, an offset gate structure is obtained. High density doping will provide normal source and drain. (See FIG. 1B)

The gate electrode and gate line may be anodized before doping to form an anodic oxide film 108. This anodic oxide film will serve as an etching stopper to protect the gate electrode during an anisotropic etching process to be performed later. The same effect can be obtained by forming a coating film such as a silicon nitride film on the gate electrode.

Thereafter, an insulator film 110 is formed to cover the gate electrode and gate line (and the anodic oxide film surrounding them). This film must be formed with sufficient coating properties and preferably has a thickness in the range of one-third to twice the height of the gate electrode and the gate line. For such a purpose, it is preferable to use a chemical vapor deposition (CVD) process such as a plasma CVD process, a low-pressure CVD process, and an atmospheric pressure CVD process. As a result, the thickness of the silicon nitride film is increased at the sides of the gate electrode and gate line as indicated by the dotted lines shown FIG. 1C.

The insulator formed as described above is subjected to anisotropic etching which proceeds with priority to etching in a direction substantially perpendicular to the substrate. This etching must be performed until the insulator film 110 is etched at flat portions and may be continued until the underlying gate insulation film is etched. This leaves substantially triangular insulators (side walls) 111 and 112 at the sides of the gate electrode and gate line because the insulator film has been made thicker in those areas than other areas. (See FIG. 1D)

Then, high density impurity doping is carried out using the side walls 111 and 112 as doping masks to form source and drain 114. LDD regions 113 are formed in the areas under the side walls because doping is not performed in those areas. (See FIG. 1E)

Thereafter, the impurities which have been doped are activated by means of thermal annealing, irradiation with intense light such as laser light or equivalents thereof (optical annealing) or the like. Further, after a layer insulator 115 is formed, a contact hole is formed in one or both of the source and drain of the TFT to form lines 116 and 117 for a second layer. (See FIG. 1F)

The above-described steps provide a TFT having an LDD structure. Although not true only for an LDD structure, the structure shown in FIG. 1 wherein the side walls 112 are provided on the sides of the gate line 106 is found to be effective for preventing the second layer wiring 117 from being cut at the steps it forms where it extends over the gate line 106 because the side walls 112 reduce the steepness of the steps.

An LDD structure and an offset gate structure can be provided as described above. According to the present invention, an LDD structure is employed for an N-channel type TFT for which a counter measure against hot carriers must be taken, whereas a normal structure or an offset gate structure is employed for a P-channel type TFT for which such a counter measure is not required. According to the present invention, a TFT used for an active matrix circuit may be of either the N-channel type or P-channel type. However, a P-channel type TFT is preferred because it suffers less deterioration in characteristics. The present invention will be described below with reference to preferred embodiments thereof.

DETAILED DESCRIPTION OF THE PREFERRED EMBODIMENTS

Figure 1A:
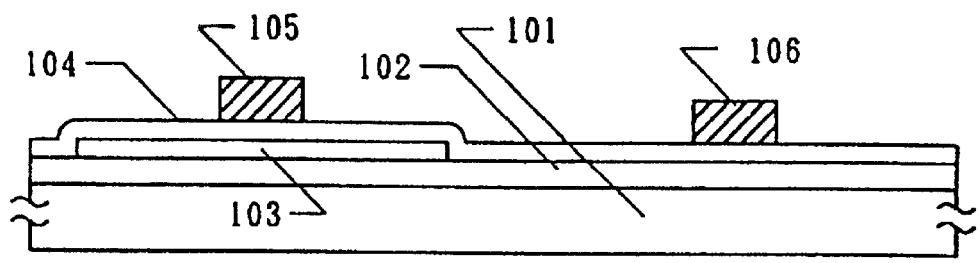
FIGS. 1A to 1F schematically illustrate the steps for forming side walls according to the present invention.
Figure 1B:
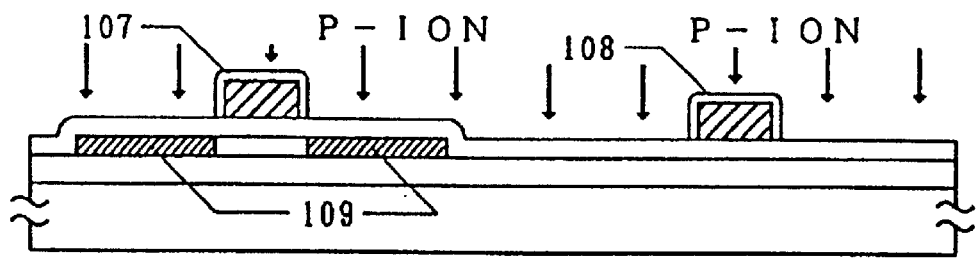

FIGS. 2A to 2G illustrate a first embodiment of the present invention. A silicon oxide film having a thickness of 1000 to 5000 Å, e.g., 2000 Å, is formed as a base oxide film 202 on a substrate (Corning 7059) 201. This oxide film is formed using a sputtering process in an oxygen atmosphere. For higher mass-productivity, it may be formed by decomposing and depositing TEOS (tetraethoxysilane) using a plasma CVD process. The silicon oxide film thus formed may be annealed at 400 to 650° C.

Thereafter, an amorphous silicon film is deposited using a plasma CVD process or LPCVD process to a thickness of 300 to 5000 Å, preferably 400 to 1000 Å, e.g., 500 Å. The film is then crystallized by keeping it in a reducing atmosphere at 550 to 600° C. for 8 to 24 hours. The crystallization may be accelerated (promoted) by adding a very small amount of metal element such as nickel which promotes the crystallization. Alternatively, this process may be carried out using laser irradiation. The resulting crystallized silicon film is etched to form island-like regions 203, 204, and 205.

The island-like regions 203 and 204 are regions in which TFTs of peripheral circuits are formed and the island-like region 205 is a region in which a TFT of an active matrix circuit is formed. Further, a silicon oxide film 206 having a thickness of 700 to 1500 Å, e.g., 1200 Å is formed on those regions using a plasma CVD process.

Figure 2A:
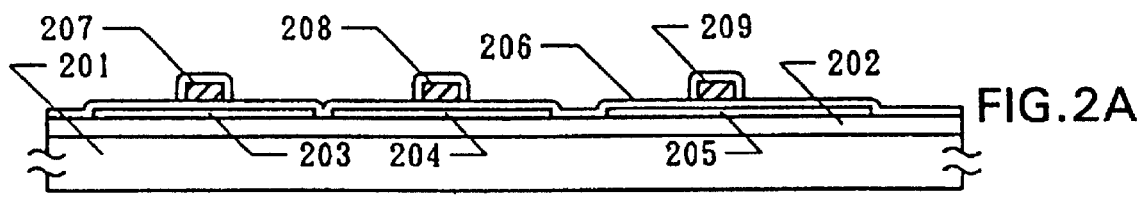
FIGS. 2A to 2G illustrate a method of fabricating TFT circuits according to a first embodiment of the present invention.

Thereafter, an aluminum (including Sc (scandium) of 0.1 to 0.5 percent by weight) film having a thickness of 1000 Å to 3 $\mu$m, e.g., 5000 Å is formed using a sputtering process and is etched to form gate electrodes 207, 208, and 209. Although not clear in the figure, all of the gate electrodes 207 through 209 are continuous to each other (FIG. 2A).

The gate electrodes 207 through 209 are anodized by applying a current to them in an electrolytic solution to form anodic oxide films having a thickness of 500 to 2500 Å, e.g., 2000 Å on the upper and side surfaces of the gate electrodes. The electrolytic solution used is obtained by diluting L-tartaric acid with ethylene glycol to a density of 5 percent and by adjusting the pH to 7.0±0.2 using ammonia. Other suitable solutions may be used instead. The substrate 201 is immersed in the electrolytic solution. The positive side of a constant current source is connected to a gate line on the substrate, and a platinum electrode is connected to the negative side. Thus, a voltage is applied with-a constant current of 20 mA and oxidation is continued until the voltage reaches 150 V. The oxidation is further continued at a constant voltage of 150 V until the current decreases below 0.1 mA. As a result, an aluminum oxide film having a thickness of 2000 Å is obtained. After the anodizing process, electrical isolation is provided on the gate electrodes and gate line where necessary. Such an isolation process may be carried out in a later step.

Figure 2B:
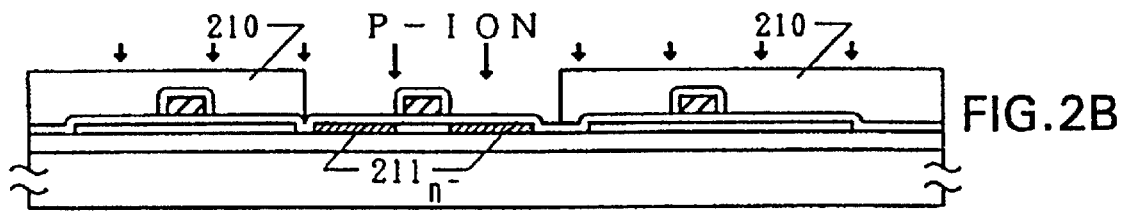
Figure 2C:
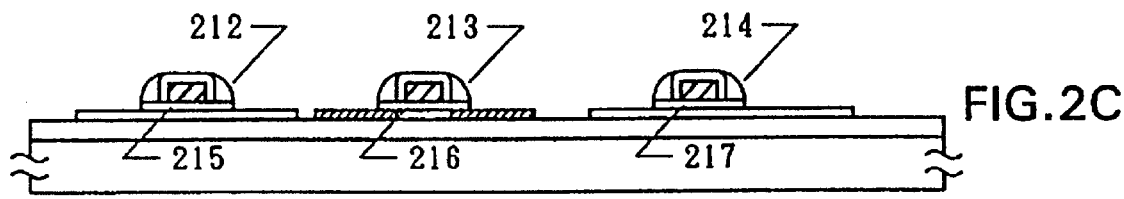
Figure 2D:
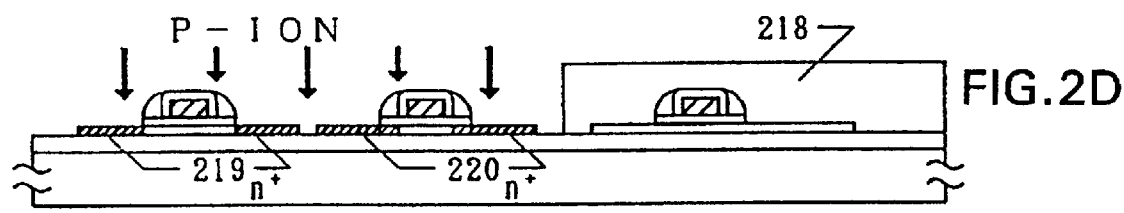
Figure 2E:
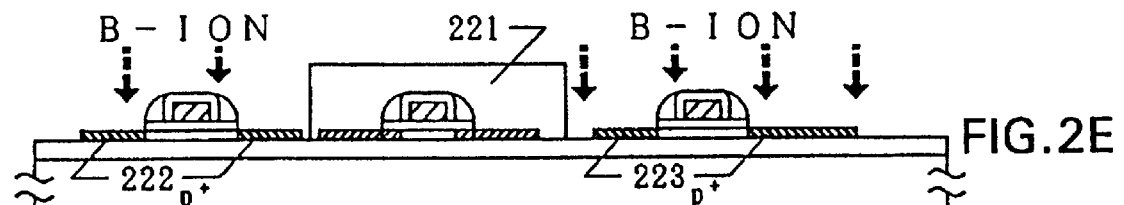
Figure 2F:
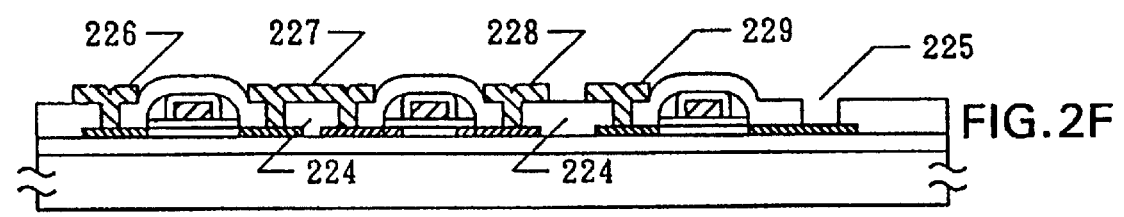
Figure 2G:
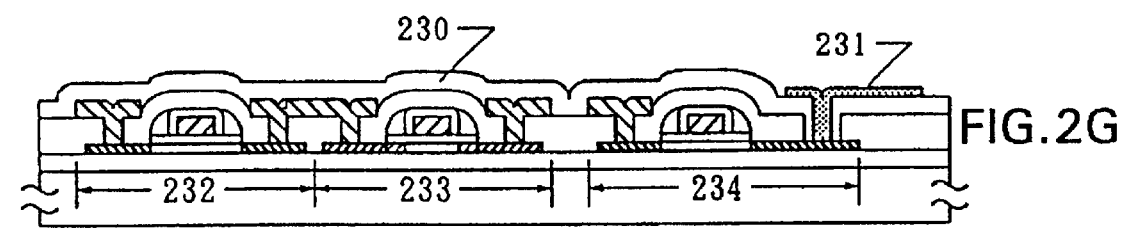

Thereafter, the regions 203 and 205 that constitute P-channel type TFTs are covered by photoresist masks 210. Phosphorous is implanted in the island-like silicon film 204 on a self-alignment basis using the gate electrode portion (i.e. the gate electrode and the anodic oxide film surrounding it) as a mask according to the ion implantation method to form an N-type low density impurity region (LDD) 211. The dose is $1 \times 10^{13}$ to $1 \times 10^{14}$ atoms/cm$^2$, and the acceleration voltage is 10 to 90 kV. For example, the dose is $2 \times 10^{13}$ atoms/cm$^2$, and the acceleration voltage is 80 kv (FIG. 2B).

Figure 1C:
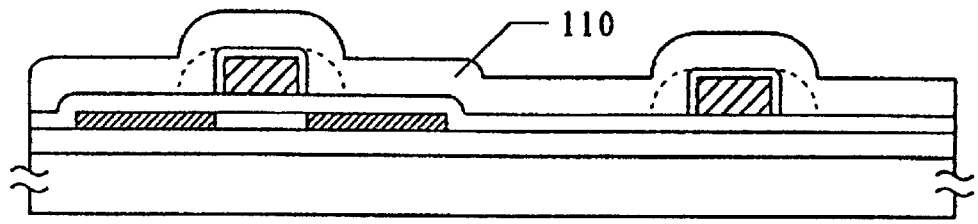

A silicon oxide film is then deposited as in the step shown at FIG. 1C using a plasma CVD process. The material gases used are TEOS and oxygen or monosilane and nitrous oxide. The optimum value for the thickness of the silicon oxide film depends on the height of the gate electrodes and gate lines. For example, in this embodiment wherein the height of the gate electrodes and gate lines including the anodic oxide films is about 6000 Å, the thickness is preferably 2000 Å to 1.2 $\mu$m which is one-third to twice the height and is set to 6000 Å in this embodiment. During this film forming step, the film thickness must be kept uniform in flat regions and good step-coverage must be provided.

Figure 1D:
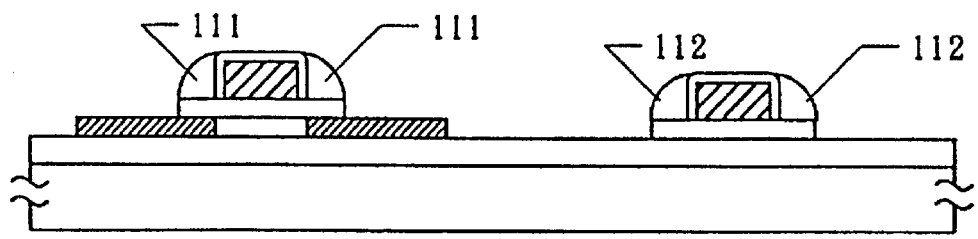
Figure 1E:
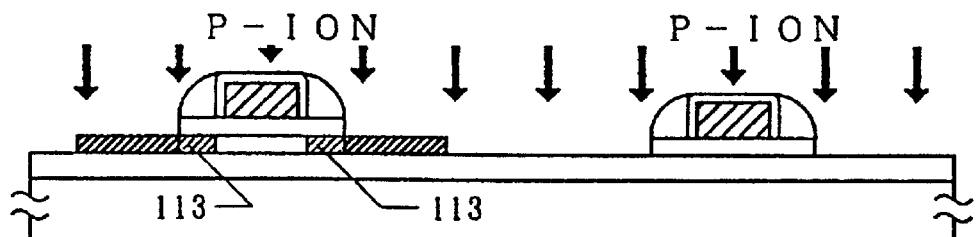
Figure 1F:
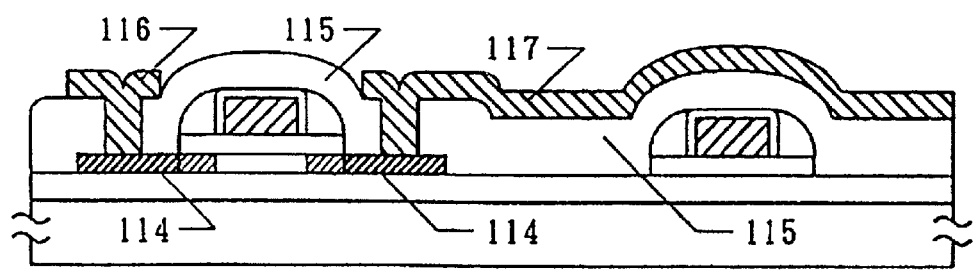

Next, anisotropic dry etching is performed according to the well-known RIE method as in the step indicated in FIG. 1D to etch the above-described silicon oxide film. In this etching step, the gate insulation film 206 is also etched. The steps described so far leave substantially triangular insulators (side walls) 212, 213, and 214 at the sides of the gate electrodes and gate line. Also, gate insulation films 215, 216, and 217 are left under the side walls and the gate electrode portions. (See FIG. 2C)

Figure 5:
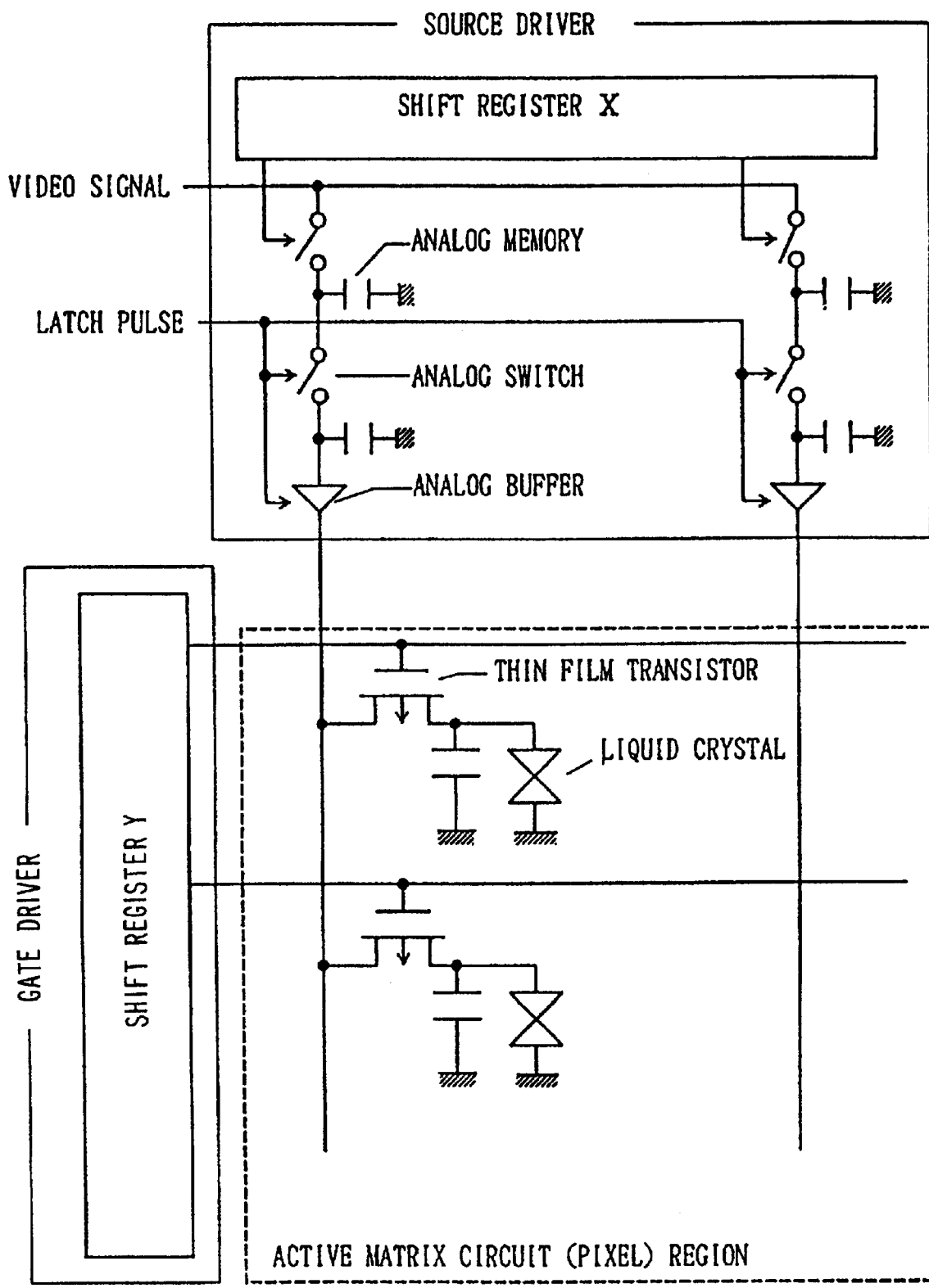
FIG. 5 is a block diagram of a monolithic active matrix circuit.

Thereafter, phosphorous is introduced again using an ion doping process. At this time, only the area of the active matrix circuit is covered by a photoresist mask 218. Since there are some spaces between the peripheral circuits and the active matrix circuit as apparent from FIG. 5, this patterning is relatively simple.

The dose in this doping step is greater than the dose employed at the step indicated by FIG. 2B by one to three figures. Further, since the gate insulation film has been etched, the optimum acceleration voltage is 10 to 30 kV. In the present embodiment, the dose is $1\times10^{15}$ atoms/cm$^2$ which is fifty times the dose for the initial phosphorous doping. The acceleration voltage is set to 10 kV. As a result, regions (source and drain) 219 and 220 are formed which are doped with phosphorous at a high density. On the other hand, low density N-type regions are left under the side walls 213 and adjacent to the high density N-type regions 220. (See FIG. 2D.)

Next, boron is introduced using an ion doping process. In this case, the region 204 in which an N-channel type TFT is to be formed is covered by a photoresist mask 221. The dose is greater than the dose of phosphorous for the step shown at FIG. 2D because the N-type region 219 is inverted to the P-type. This embodiment employs a dose of $3\times10^{15}$ atoms/cm$^2$ which is three times the dose for the phosphorous doping at FIG. 2D. The acceleration voltage is set to 10 kV. As a result, the N-type region 219 is inverted to obtain a P-type region 222. The island-like region 205 is also doped with boron to form a P-type region (source/drain) 223. (See FIG. 2E)

Then, a KrF excimer laser beam having a wavelength of 248 nm and a pulse width of 20 ns is directed to the impurities doped to activate them (a laser annealing process).

The adequate energy density of the laser beam is 200 to 400 mJ/cm$^2$, preferably 250 to 300 mJ/cm$^2$. This laser irradiation step may be replaced by thermal annealing. Alternatively, the laser irradiation may be followed by thermal annealing.

A silicon oxide film is then formed on the entire surface as a layer insulation film 224 to a thickness of 5000 Å. Contact holes are formed in the sources and drains of the TFTS. Simultaneously, a contact hole 225 is formed in the impurity region of the TFT for the active matrix circuit at the side of a pixel electrode thereof. Then, aluminum lines and electrodes 226 through 229 for a second layer are formed. The thickness of the aluminum lines is substantially the same as that of the gate electrodes and gate lines, i.e., 4000 to 6000 Å. No metal wiring is provided in the contact hole 225. Referring now to the active matrix circuit, metal line 229 is a signal line, and the gate electrode 209 is connected to a gate line. (See FIG. 2F.)

Finally, a passivation film 230 constituted by a silicon nitride film is formed using a plasma CVD process. A contact hole is formed again in the position in which the contact hole 225 has been formed to expose the impurity region. An indium tin oxide (ITO) film which is a transparent conductive material is deposited using a sputtering process and is etched to form a pixel electrode 231.

The above-described steps provide an N-channel type thin film transistor 232 and a P-channel type thin film transistor 233 for peripheral driver circuits and a P-channel type thin film transistor 234 for an active matrix circuit. As apparent from the above-described steps, both of the transistors 232 and 234 are P-channel transistors having an offset structure. However, the source and drain of the former are doped with both phosphorous and boron, whereas the source and drain of the latter are doped only with boron. The structure of the latter is advantageous especially wherein a high reverse bias voltage is applied as in the case of the switching element in an active matrix circuit.

A second embodiment of the present invention will now be described.

Figure 4A:
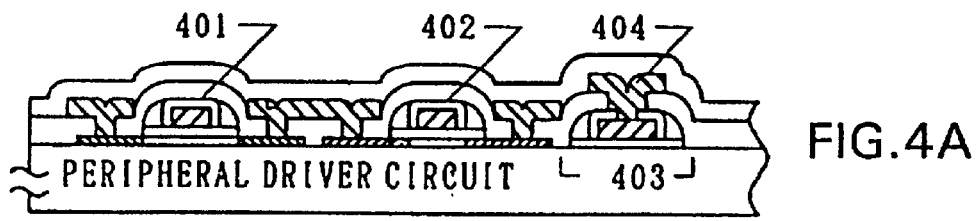
FIGS. 4A to 4F illustrate examples of TFT circuits according to third and fourth embodiments of the present invention.
Figure 4B:
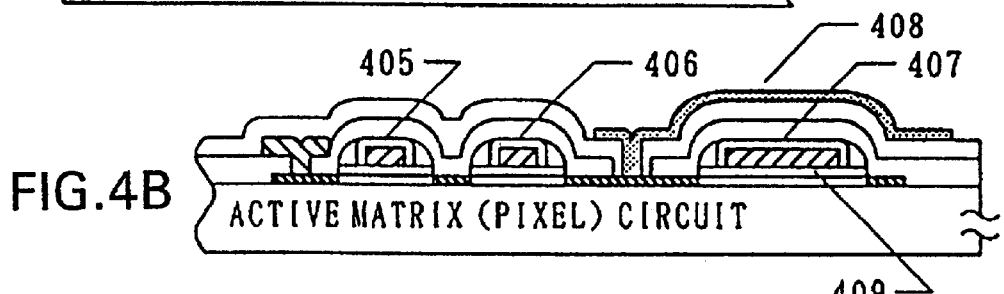
Figure 4C:
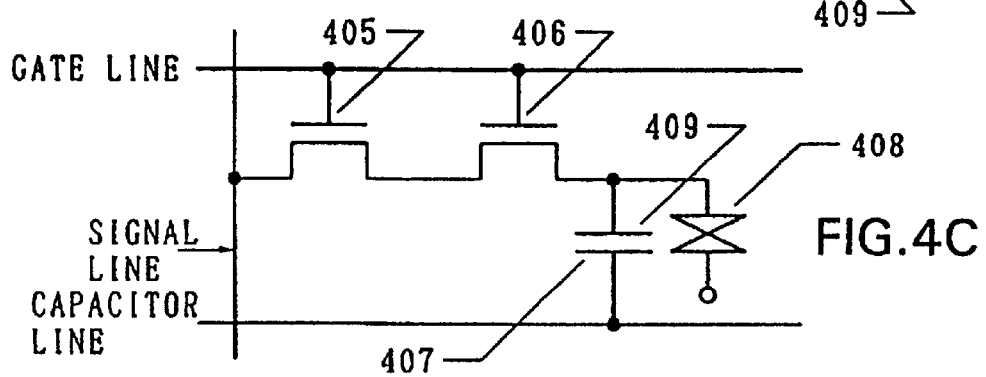

This embodiment relates to a monolithic active matrix circuit which is schematically shown FIGS. 4A to 4C. The elements in this embodiment are constructed in a manner which is basically the same as that in the first embodiment. The present embodiment is an improvement over the monolithic active matrix circuit shown at FIG. 2G.

Transistors 401 and 402 are of the N-channel type and P-channel type, respectively, and are both used in a peripheral driving circuit. The peripheral driving circuit has a contact portion 403 for establishing contact between the gate line and a line 404 of a second layer. The contact hole is formed in both of the layer insulator and anodic oxide. (See FIG. 4A)

A circuit diagram of a unit pixel of the active matrix circuit is shown in FIG. 4C. The present embodiment employs a double gate circuit wherein transistors 405 and 406 are connected in series as a switching element. A line 407 which extends in the same layer as the gate electrodes are formed on an island-like region to which a pixel electrode 408 is connected to form an auxiliary capacity 407 with the gate insulation film serving as a dielectric. The line 407 is kept at a constant voltage as a capacity line so that a MOS capacity is established between it and the island-like region. (See FIGS. 4B and 4C.)

FIGS. 3A to 3G illustrate a third embodiment of the present invention. Crystalline island-like silicon regions 303, 304, and 305 are formed on a substrate 301 on which a silicon oxide film having a thickness of 2000 Å is formed as a base oxide film 302. In addition, a silicon oxide film 306 having a thickness of 1200 Å is formed thereon using a plasma CVD process. The island-like regions 303 and 304 represent TFTs for peripheral circuits of the active matrix circuit, whereas the island-like region 305 represents a region in which a TFT for the active matrix circuit is formed. Further, aluminum gate electrodes 307, 308, and 309 are formed which are 5000 Å thick and are anodized on the side and upper surfaces thereof. (See FIG. 3A)

Figure 3A:
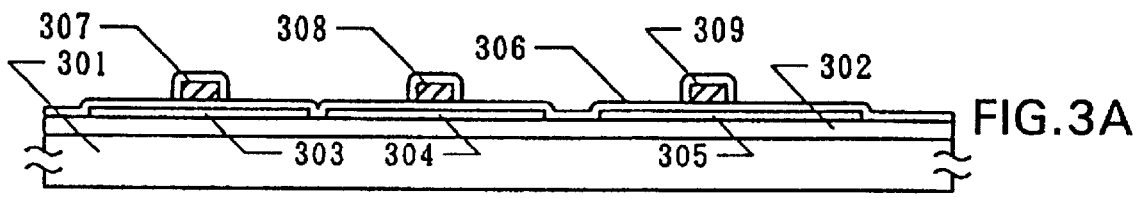
FIGS. 3A to 3G illustrate a method of fabricating TFT circuits according to a second embodiment of the present invention.
Figure 3B:
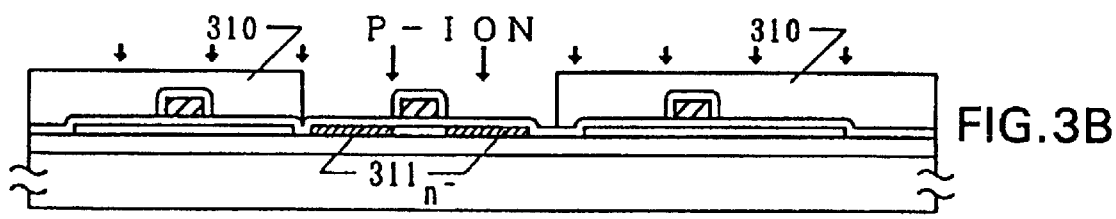

Thereafter, the regions 303 and 305 in which P-channel type TFTs are to be formed are covered with photoresist masks 310. Phosphorous is implanted in the island-like silicon film 304 on a self-alignment basis using the gate electrode portion as a mask according to the ion doping method to form low density N-type regions 311 The doping is carried out with a dose of $2\times10^{13}$ atoms/cm$^2$ and an acceleration voltage of 80 kV. (FIG. 3B)

Figure 3C:
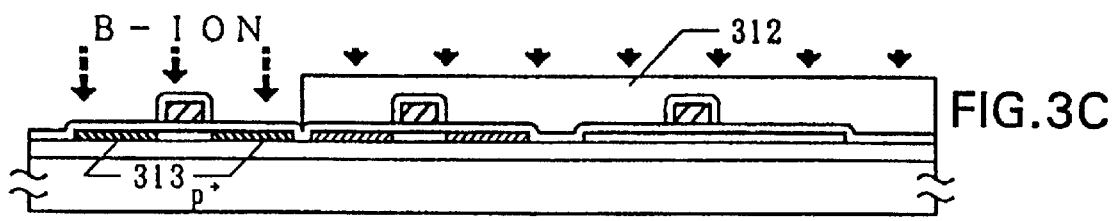
Figure 3D:
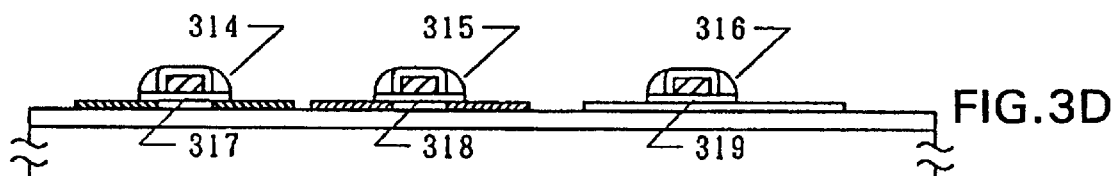
Figure 3E:
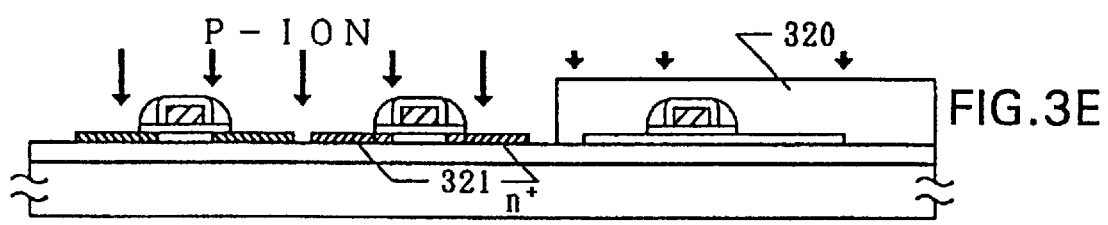
Figure 3F:
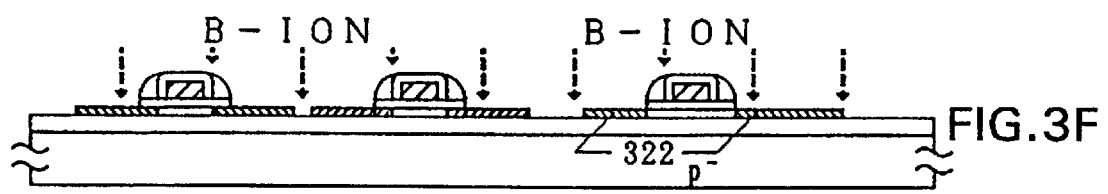
Figure 3G:
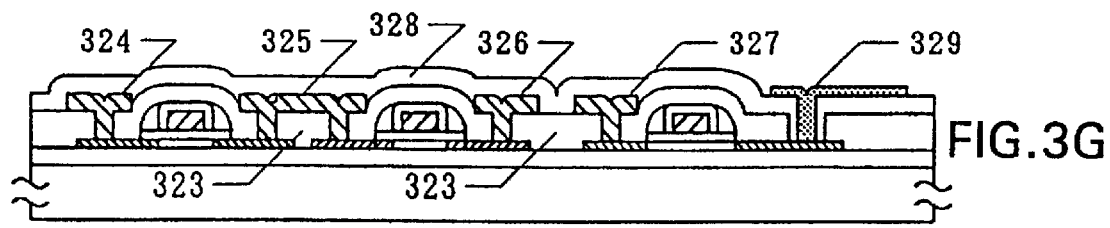

Next, the region 304 and the active matrix region 305 in which N-channel type TFTs are to be formed are covered with a photoresist mask 310. Phosphorous is implanted in the island-like silicon film 303 on a self-alignment basis using the gate electrode portion as a mask according to the ion doping method to form high density P-type regions 311. The doping is carried out with a dose of $3 \times 10^{15}$ atoms/cm$^2$ and an acceleration voltage of 60 kV. (FIG. 3C)

Side walls 314, 315, and 316 are formed at the sides of the gate electrodes 307 through 309 through the steps as shown in FIGS. 1A to 1F. Gate insulation films 317, 318, and 319 are left under the side walls and the gate electrodes. (See FIG. 3D)

Thereafter, phosphorous is introduced again using an ion doping process. At this time, only the area of the active matrix circuit is covered by a photoresist mask 320. The dose in this step is greater than the dose employed at FIG. 3B by one to three figures. Further, since the gate insulation film has been etched, the optimum acceleration voltage is 10 to 30 kV. In the present embodiment, the dose is $1 \times 10^{15}$ atoms/cm$^2$ which is fifty times the dose for the initial phosphorous doping. The acceleration voltage is set to 10 kV. As a result, N-type regions (source and drain) 321 are formed which are doped with phosphorous at high density. On the other hand, a region 313 which has been doped with boron remains as a P-type region because the dose of boron is greater than the dose of phosphorous. Further, the areas of the region 313 under the side walls 314 are not doped with phosphorous at all. Low density N-type regions are left under the side walls 315 and adjacent to the high density N-type regions 321. (See FIG. 3E)

Next, low density boron is introduced using an ion doping process after removing the photoresist mask 320. The dose in this case is preferable smaller than the dose for the above-described boron doping by one to three figures. The present embodiment employs a dose of $3 \times 10^{13}$ atoms/cm$^2$ which is 1/100 of the dose for the boron doping at FIG. 3C. The acceleration voltage is set to 10 kV. As a result, a low density P-type region 322 is formed in the island-like region 305 which constitutes the TFT of the active matrix circuit. (See FIG. 3F)

Further, a KrF excimer laser beam having a wavelength of 248 nm and a pulse width of 20 ns is directed to the impurities doped to activate them (a laser annealing process).

The adequate energy density of the laser beam is 200 to 400 mJ/cm$^2$, preferably 250 to 300 mJ/cm$^2$. This laser irradiation step may be replaced by thermal annealing. Alternatively, the laser irradiation may be followed by thermal annealing.

Finally, as in the first embodiment, layer insulators 323, metal lines 324 though 327, a passivation film 328, and an ITO pixel electrode 329 are formed. (See FIG. 3G)

The above-described steps provide an N-channel type thin film transistor and a P-channel type thin film transistor for peripheral driver circuits and a P-channel type thin film transistor 234 for an active matrix circuit. As apparent from the above-described steps, the N-channel type TFT for the peripheral circuit has an LDD structure. As to the P-channel type TFTs, the TFT for the peripheral circuit has a normal structure, while the TFT for the active matrix circuit is an offset gate type TFT. In addition, the source and drain of the TFT for the active matrix circuit are doped only at a low density.

Such a structure is idealistic for use in a switching element in an active matrix circuit. The offset gate structure reduces leak current (also referred to as OFF current) which is generated when a reverse bias voltage is applied to the gate electrode, thereby suppressing leakage of the electrical charge stored in the pixel cell. Additionally, the low impurity density at the source and drain prevents the deterioration of characteristics caused by the application of a reverse bias current.

On the other hand, since high speed operations are desired for peripheral circuits, normal TFTs as illustrated are preferred.

A fourth embodiment of the present invention will now be described.

Figure 4D:
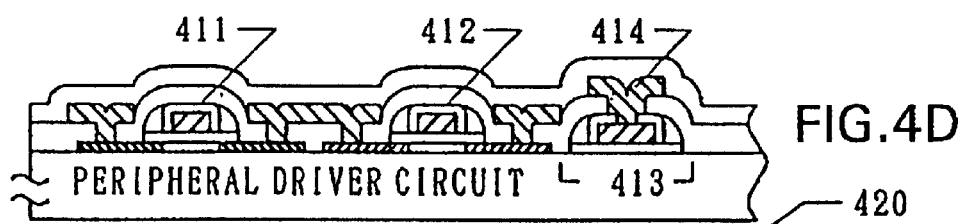
Figure 4E:
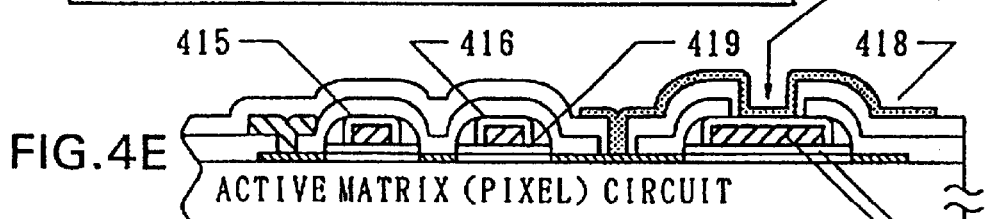
Figure 4F:
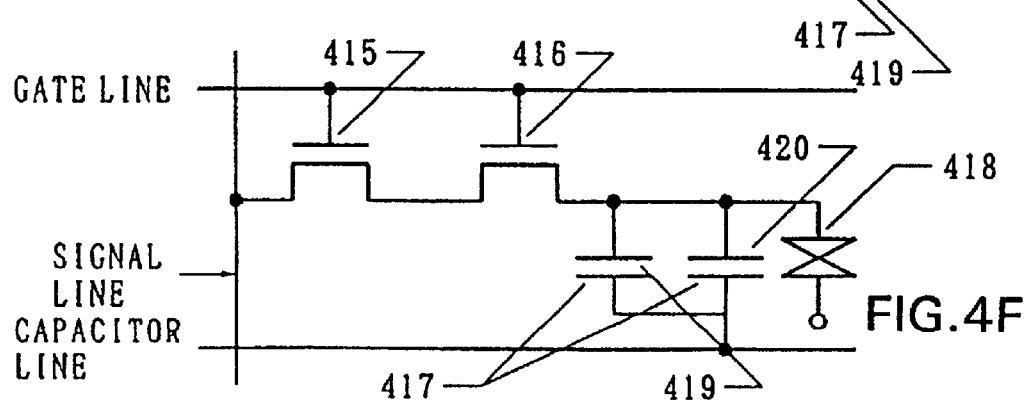

This embodiment relates to a monolithic active matrix circuit which is schematically shown in FIGS. 4D to 4F. The elements in this embodiment are constructed in a manner which is basically the same as that in the third embodiment. The present embodiment is an improvement over the monolithic active matrix circuit shown in FIG. 3G.

Transistors 411 and 412 are of the N-channel type and P-channel type, respectively, and are both used in a peripheral driving circuit. The peripheral driving circuit has a contact hole 413 for establishing contact between the gate line and a line 414 of a second layer. The contact hole is formed in both of the layer insulator and anodic oxide. (See FIG. 4D)

A circuit diagram of a unit pixel of the active matrix circuit is shown in FIG. 4F. In the present embodiment, transistors 415 and 416 are connected in series as a switching element. Like the second embodiment, a MOS capacity 419 is formed by an island-like region and a line 417. In addition, a capacity 420 is established between the pixel electrode and the line 417 by etching a passivation film and the later insulator and using the anodic oxide as a dielectric. As in the second embodiment, the line 417 is kept at a constant voltage as a capacity line. (See FIGS. 4E and 4F)

According to the present invention, there is proposed a TFT which exhibits characteristics and reliability required for each of the circuits that constitute a monolithic active matrix circuit, thereby improving the display characteristics of the matrix circuit.

Various modifications to the present invention will become apparent to those skilled in the art from the foregoing description and accompanying drawings. Accordingly, the present invention is to be limited solely by the scope of the following claims.

I claim:

1. An active matrix device comprising:
   a semiconductor layer formed over a substrate;
   at least first and second thin film transistors formed with said semiconductor layer, each of said first and second thin film transistors including source, drain and channel regions formed in said semiconductor layer, and a gate electrode adjacent to said channel forming region;
   a pixel electrode formed over said substrate;
   a signal line formed over said substrate, electrically connected to said pixel electrode through said first and second thin film transistors in series;
   a capacitor forming electrode and a portion of said semiconductor layer and an insulating film interposed therebetween,
   wherein said portion of the semiconductor layer is disposed between a pair of impurity regions in said semiconductor layer, and said impurity regions have a same conductivity type as the source and drain regions of said first and second thin film transistors.

2. The active matrix device according to claim 1 wherein said portion of the semiconductor layer has a same conductivity type as said channel region.

3. The active matrix device according to claim 1 wherein said semiconductor layer comprises crystalline silicon.

4. An active matrix device comprising:
- a gate wiring including at least first and second gate electrodes formed over a substrate;
- a signal line formed over said substrate;
- a pixel electrode formed over said substrate;
- a semiconductor layer formed over said substrate and adjacent to said at least first and second gate electrodes;
- a first channel region and a second channel region formed in said semiconductor layer adjacent to said first gate electrode and said second gate electrode, respectively;
- a first impurity region formed in said semiconductor layer wherein said first impurity region is connected to said signal line;
- a second impurity region formed in said semiconductor layer wherein said second impurity region has a same conductivity type as said first impurity region and extends between said first and second channel regions;
- a third impurity region formed in said semiconductor layer wherein said third impurity region has a same conductivity type as said first impurity region and is connected to said pixel electrode;
- a capacitor forming electrode adjacent to a portion of said semiconductor layer wherein said portion of the semiconductor layer has a same conductivity type as said first and second channel regions;
- a fourth impurity region formed in said semiconductor layer and having a same conductivity type as said first impurity region wherein said portion of the semiconductor layer extends between said third impurity region and said fourth impurity region;
- a capacitor comprising said capacitor forming electrode and said portion of the semiconductor layer with an insulating film interposed therebetween.

5. The active matrix device according to claim 4 wherein said semiconductor layer comprises crystalline silicon.

6. An active matrix device comprising:
- a semiconductor layer formed over a substrate;
- at least first and second thin film transistors of a same channel conductivity type formed with said semiconductor layer, each of said first and second thin film transistors including source, drain and channel regions formed in said semiconductor layer, and a gate electrode adjacent to said channel forming region;
- a pixel electrode formed over said substrate;
- a signal line formed over said substrate, electrically connected to said pixel electrode through said first and second thin film transistors in series;
- a first capacitor comprising a capacitor forming electrode and a portion of said semiconductor layer and a first insulating film interposed therebetween; and
- a second capacitor comprising said capacitor forming electrode and said pixel electrode with a second insulating film interposed therebetween;
- wherein said portion of the semiconductor layer is disposed between a pair of impurity regions in said semiconductor layer, and said impurity regions have a same conductivity type as the source and drain regions of said first and second thin film transistors.

7. The active matrix device according to claim 6 wherein said semiconductor layer comprises crystalline silicon.

8. An active matrix device comprising having at least an active matrix circuit and a driver circuit for driving the active matrix circuit, (a) said active matrix circuit comprising:
- a pixel electrode formed over a substrate;
- a capacitor forming electrode formed between said substrate and said pixel electrode;
- at least two thin film transistors connected to said pixel electrode in series, each of thin film transistors comprising a semiconductor layer comprising at least a channel forming region and source and drain regions, and a gate electrode provided adjacent to said semiconductor layer with an insulating film interposed therebetween;
- a gate line connected to each of said gate electrodes of said thin film transistors;
- a signal line connected to one of said source regions of said thin film transistors connected in series,
- wherein an auxiliary capacitor is formed between said semiconductor layer and said capacitor forming electrode;

(b) said driver circuit comprising:
- a CMOS device comprising a pair of a P-channel thin film transistor and an N-channel thin film transistor formed over said substrate,
- wherein source and drain regions of one of said P-channel thin film transistor and said N-channel thin film transistor are doped with a first impurity and source and drain regions of the other one of said P-channel thin fill transistor and said N-channel thin film transistor are doped with both said first impurity and a second impurity having an opposite conductivity type to said first impurity.

9. The active matrix device according to claim 8 wherein said semiconductor layer comprises crystalline silicon.

10. An active matrix device comprising having at least an active matrix circuit and a driver circuit for driving the active matrix circuit, (a) said active matrix circuit comprising:
- a semiconductor layer formed over a substrate;
- at least first and second thin film transistors formed with said semiconductor layer, each of which includes a channel forming region in said semiconductor layer and a gate electrode adjacent to said channel forming region;
- a pixel electrode formed over said substrate;
- a signal line formed over said substrate, electrically connected to said pixel electrode through said first and second thin film transistors in series;
- a capacitor forming electrode formed adjacent to a portion of said semiconductor layer to form a capacitor therebetween, wherein said portion of said semiconductor layer has a same conductivity type as said channel forming region;

(b) said driver circuit comprising:
- a CMOS device comprising a pair of a P-channel thin film transistor and an N-channel thin film transistor formed over said substrate,
- wherein source and drain regions of one of said P-channel thin film transistor and said N-channel thin film transistor are doped with a first impurity and source and drain regions of the other one of said P-channel thin film transistor and said N-channel thin film transistor are doped with both said first impurity and a second impurity having an opposite conductivity type to said first impurity.

11. The active matrix device according to claim 10 wherein said semiconductor layer comprises crystalline silicon.

12. An active matrix device comprising having at least an active matrix circuit and a driver circuit for driving the active matrix circuit,
  (a) said active matrix circuit comprising:
  a pixel electrode formed over a substrate;
  a capacitor forming electrode formed between said substrate and said pixel electrode;
  at least two thin film transistors connected to said pixel electrode in series, each thin film transistors comprising a semiconductor layer comprising at least a channel forming region, source and drain regions, and a gate electrode provided adjacent to said semiconductor layer with an insulating film interposed therebetween;
  a gate line connected to each of said gate electrodes of said thin film transistors;
  a signal line connected to one of said source regions of said thin film transistors connected in series,
  wherein a first capacitor is formed between said semiconductor layer and said capacitor forming electrode and a second capacitor is formed between said capacitor forming electrode and said pixel electrode;
  (b) said driver circuit comprising:
  a CMOS device comprising a pair of a P-channel thin film transistor and an N-channel thin film transistor formed over said substrate,
  wherein source and drain regions of one of said P-channel thin film transistor and said N-channel thin film transistor are doped with a first impurity and source and drain regions of the other one of said P-channel thin film transistor and said N-channel thin film transistor are doped with both said first impurity and a second impurity having an opposite conductivity type to said first impurity.

13. The active matrix device according to claim 12 wherein said semiconductor layer comprises crystalline silicon.

14. An active matrix device comprising having at least an active matrix circuit and a driver circuit for driving the active matrix circuit,
  (a) said active matrix circuit comprising:
  a semiconductor layer formed over a substrate;
  at least first and second thin film transistors of a same channel conductivity type formed with said semiconductor layer, each of said first and second thin film transistors including source, drain and channel regions formed in said semiconductor layer, and a gate electrode adjacent to said channel forming region;
  a pixel electrode formed over said substrate;
  a signal line formed over said substrate, electrically connected to said pixel electrode through said first and second thin film transistors in series;
  a first capacitor comprising a capacitor forming electrode and a portion of said semiconductor layer and a first insulating film interposed therebetween; and
  a second capacitor comprising said capacitor forming electrode and said pixel electrode with a second insulating film interposed therebetween;
  wherein said portion of the semiconductor layer is disposed between a pair of impurity regions in said semiconductor layer, and said impurity regions have a same conductivity type as the source and drain regions of said first and second thin film transistors;
  (b) said driver circuit comprising:
  a CMOS device comprising a pair of a P-channel thin film transistor and an N-channel thin film transistor formed over said substrate,
  wherein source and drain regions of one of said P-channel thin film transistor and said N-channel thin film transistor are doped with a first impurity and source and drain regions of the other one of said P-channel in film transistor and said N-channel thin film transistor are doped with both said first impurity and a second impurity having an opposite conductivity type to said first impurity.

15. A semiconductor device having at least an active matrix circuit and a driver circuit for driving the active matrix circuit,
  (a) said active matrix circuit comprising:
  a semiconductor layer formed over a substrate;
  at least first and second thin film transistors formed with said semiconductor layer, each of said first and second thin film transistors including source, drain and channel regions formed in said semiconductor layer and a gate electrode adjacent to said channel forming region; and
  a pixel electrode connected to one of said first and second thin film transistors,
  (b) said driver circuit comprising:
  at least one CMOS device comprising a pair of a P-channel and N channel thin film transistors formed over said substrate, said N-channel thin film transistor having at least one LDD region.

16. The device according to claim 15 wherein said semiconductor layer comprises crystalline silicon.

17. The device according to claim 15 wherein said semiconductor layer has a thickness of 400 through 1000 Å.

18. The device according to claim 15 further comprising a capacitor forming electrode formed over said substrate.

19. The device according to claim 18 wherein an auxiliary capacitor is formed between said pixel electrode and said capacitor forming electrode with an interlayer insulating film therebetween.

20. The device according to claim 18 wherein said capacitor forming electrode is kept at a constant voltage.

21. The device according to claim 15 wherein said gate electrode is located over said semiconductor layer.

22. A semiconductor device having at least an active matrix circuit and a driver circuit for driving the active matrix circuit,
  a) said active matrix circuit comprising: a semiconductor layer formed over a substrate;
  at least first and second thin film transistors formed with said semiconductor layer, each of said first and second thin film transistors including source, drain and channel regions formed in said semiconductor layer and a gate electrode adjacent to said channel forming region;
  a pixel electrode connected to one of said first and second thin film transistors; and
  a capacitor formed between a portion of said semiconductor layer and a capacitor forming electrode,
  wherein said portion of the semiconductor layer has a same conductivity type as said channel forming region,
  (b) said driver circuit comprising:
  at least one CMOS device formed over said substrate, said CMOS device comprising a pair of P-channel and N-channel thin film transistors, said N-channel thin film transistor having at least one LDD region.

23. The device according to claim 22 wherein said semiconductor layer comprises crystalline silicon.

24. The device according to claim 22 wherein said semiconductor layer has a thickness of 400 through 1000 Å.

25. The device according to claim 22 further comprising an auxiliary capacitor formed between said pixel electrode and said capacitor forming electrode with an interlayer insulating film therebetween.

26. The device according to claim 22 wherein said capacitor forming electrode is kept at a constant voltage.

27. The device according to claim 22 wherein said gate electrode is located over said semiconductor layer.

28. A semiconductor device having at least an active matrix circuit and a driver for driving the active matrix circuit,
(a) said active matrix circuit comprising:
a semiconductor layer formed over a substrate;
at least first and second thin film transistors formed with said semiconductor layer, each of said first and second thin film transistors including source, drain and channel regions formed in said semiconductor layer and a gate electrode adjacent to said channel forming region;
a capacitor forming electrode formed over said substrate; and
a pixel electrode connected to one of said first and second thin film transistors;
a first capacitor formed between a portion of said semiconductor layer and said capacitor forming electrode; and
a second capacitor between said capacitor forming electrode and said pixel electrode,
wherein said portion of the semiconductor layer has a same conductivity type as the channel regions in said first and second thin film transistors,
(b) said driver circuit comprising:
at least one CMOS device comprising a pair of P-channel and N channel thin film transistors formed over said substrate, said N-channel thin film transistor having at least one LDD region.

29. The device according to claim 28 wherein said semiconductor layer comprises crystalline silicon.

30. The device according to claim 28 wherein said semiconductor layer has a thickness of 400 through 1000 Å.

31. The device according to claim 28 further comprising a first interlayer insulating film formed between said semiconductor layer and said capacitor forming electrode, and a second interlayer insulating film formed between said capacitor forming electrode and said pixel electrode.

32. The device according to claim 28 wherein said capacitor forming electrode is kept at a constant voltage.

33. The device according to claim 28 wherein said gate electrode is located over said semiconductor layer.

34. A semiconductor device having at least an active matrix circuit and a driver circuit for driving the active matrix circuit,
(a) said active matrix circuit comprising:
a semiconductor layer formed over a substrate;
at least first and second thin film transistors formed with said semiconductor layer, each of said first and second thin film transistors including source, drain and channel regions formed in said semiconductor layer, and a gate electrode adjacent to said channel forming region;
a pixel electrode connected to one of said first and second thin film transistors; and
a capacitor comprising a capacitor forming electrode and a portion of said semiconductor layer and an insulating film interposed therebetween,
(b) said driver circuit comprising:
at least one CMOS device comprising a pair of P-channel and N channel thin film transistors formed over said substrate, said N-channel thin film transistor having at least one LDD region, and said P-channel thin film transistor having no LDD region.

35. The device according to claim 34 wherein said semiconductor layer comprises crystalline silicon.

36. The device according to claim 34 wherein said semiconductor layer has a thickness of 400 through 1000 Å.

37. The device according to claim 34 further comprising an auxiliary capacitor formed between said pixel electrode and said capacitor forming electrode with an interlayer insulating film therebetween.

38. The device according to claim 34 wherein said capacitor forming electrode is kept at a constant voltage.

39. The device according to claim 34 wherein said gate electrode is located over said semiconductor layer.

40. An active matrix device comprising:
a substrate having an insulating surface;
an active matrix circuit formed over said substrate, said active matrix circuit comprising:
a semiconductor layer formed over said substrate;
at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
a metal layer formed over said substrate connected to one of said first and second thin film transistors,
a peripheral driving circuit formed over said substrate comprising a CMOS circuit including an N-channel thin film transistor and a P-channel thin film transistor, each of said N-channel thin film transistor and said P-channel thin film transistor comprising a semiconductor layer having a channel forming region and source and drain regions, and a gate electrode adjacent to said channel forming region with a gate insulating film interposed therebetween, and
a passivation film formed over said first and second thin film transistors, and said CMOS circuit.

41. A device according to claim 40, wherein said semiconductor layer comprises crystalline silicon.

42. A device according to claim 40, wherein said passivation film comprises silicon nitride.

43. An active matrix device comprising:
a substrate having an insulating surface;
an active matrix circuit formed over said substrate, said active matrix circuit comprising:
a semiconductor layer formed over said substrate;
at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween; and
a metal layer formed over said substrate connected to one of said first and second thin film transistors,
a peripheral driving circuit formed over said substrate comprising a CMOS circuit including an N-channel thin film transistor and a P-channel thin film transistor, each of said N-channel thin film transistor and said P-channel thin film transistor comprising a semiconductor layer having a channel forming region and source and drain regions, and a gate electrode adjacent to said channel forming region with a gate insulating film interposed therebetween, wherein said N-channel thin film transistor has a LDD structure, and a passivation film formed over said first and second thin film transistors, and said CMOS circuit.

44. A device according to claim 43, wherein said semiconductor layer comprises crystalline silicon.

45. A device according to claim 43, wherein said passivation film comprises silicon nitride.

46. An active matrix device comprising:

a substrate having an insulating surface;

an active matrix circuit formed over said substrate, said active matrix circuit comprising:
  a semiconductor layer formed over said substrate;
  at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
  an interlayer insulating film formed over said first and second thin film transistors;
  a metal layer connected to one of said first and second thin film transistors via said interlayer insulating film;
  passivation film formed over said interlayer insulating film and said metal layer; and
  a pixel electrode formed on said passivation film connected to the other one of said first and second thin film transistors, a peripheral driving circuit formed over said substrate comprising:
  a CMOS circuit including an N-channel thin film transistor and a P-channel thin film transistor, each of said N-channel thin film transistor and said P-channel thin film transistor comprising a semiconductor layer having a channel forming region and source and drain regions, and a gate electrode adjacent to said channel forming region with a gate insulating film interposed therebetween; and
  said passivation film formed over said CMOS circuit.

47. A device according to claim 46, wherein said interlayer insulating film comprises silicon oxide.

48. A device according to claim 46, wherein said passivation film comprises silicon nitride.

49. An active matrix device comprising:

a substrate having an insulating surface;

an active matrix circuit formed over said substrate, said active matrix circuit comprising:
  a semiconductor layer formed over said substrate;
  at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
  an interlayer insulating film formed over said first and second thin film transistor;
  a metal layer connected to one of said first and second thin film transistors via said interlayer insulating film;
  a passivation film formed over said interlayer insulating film and said metal layer; and
  a pixel electrode formed on said passivation film connected to the other one of said first and second thin film transistors, a peripheral driving circuit formed over said substrate comprising:
  a CMOS circuit including an N-channel thin film transistor and a P-channel thin film transistor, each of said N-channel thin film transistor and said P-channel thin film transistor comprising a semiconductor layer having a channel forming region and source and drain regions, and a gate electrode adjacent to said channel forming region with a gate insulating film interposed therebetween, wherein said N-channel thin film transistor has a LDD structure; and
  said passivation film formed over said CMOS circuit.

50. A device according to claim 49, wherein said interlayer insulating film comprises silicon oxide.

51. A device according to claim 49, wherein said passivation film comprises silicon nitride.

52. An active matrix device comprising:

a substrate having an insulating surface;

an active matrix circuit formed over said substrate, said active matrix circuit comprising:
  a semiconductor layer formed over said substrate;
  at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
  a capacitor forming electrode formed over said substrate;
  a pixel electrode formed over said first and second thin film transistors and said capacitor forming electrode, said pixel electrode connected to one of said first and second thin film transistors; and
  a capacitor formed between said capacitor forming electrode and a portion of said semiconductor layer, a peripheral driving circuit formed over said substrate comprising a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween, and a passivation film formed over said first and second thin film transistors, said capacitor forming electrode, and said CMOS circuit.

53. A device according to claim 52, wherein said semiconductor layer comprises crystalline silicon.

54. A device according to claim 52, wherein said passivation film comprises silicon nitride.

55. An active matrix device comprising:

a substrate having an insulating surface;

an active matrix circuit formed over said substrate, said active matrix circuit comprising:
  a semiconductor layer formed over said substrate;
  at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
  a capacitor forming electrode formed over said substrate;

a pixel electrode formed over said first and second thin film transistors and said capacitor forming electrode, said pixel electrode connected to one of said first and second thin film transistors; and a capacitor formed between said capacitor forming electrode and a portion of said pixel electrode, a peripheral driving circuit formed over said substrate comprising a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween, and a passivation film formed over said first and second thin film transistors, said capacitor forming electrode, and said CMOS circuit.

56. A device according to claim 55, wherein said semiconductor layer comprises crystalline silicon.

57. A device according to claim 55, wherein said passivation film comprises silicon nitride.

58. An active matrix device comprising:

a substrate having an insulating surface;

an active matrix circuit formed over said substrate, said active matrix circuit comprising:

a semiconductor layer formed over said substrate;

at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;

a capacitor forming electrode formed over said substrate;

a pixel electrode formed over said first and second thin film transistors and said capacitor forming electrode, said pixel electrode connected to one of said first and second thin film transistors;

a first capacitor formed between said capacitor forming electrode and a portion of said semiconductor layer, and a second capacitor formed between said capacitor forming electrode and a portion of said pixel electrode, a peripheral driving circuit formed over said substrate comprising a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween, and a passivation film formed over said first and second thin film transistors, said capacitor forming electrode, and said CMOS circuit.

59. A device according to claim 58, wherein said semiconductor layer comprises crystalline silicon.

60. A device according to claim 58, wherein said passivation film comprises silicon nitride.

61. An active matrix device comprising:

a substrate having an insulating surface;

an active matrix circuit formed over said substrate, said active matrix circuit comprising:

a semiconductor layer formed over said substrate;

at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;

a passivation film formed over said first and second thin film transistors, said passivation film having at least one contact hole;

a pixel electrode connected to one of said first and second thin film transistors, said pixel electrode being directly in contact with a portion of said semiconductor layer via said contact hole in said passivation film; and a capacitor forming electrode formed between said semiconductor layer and pixel electrode, a peripheral driving circuit formed over said substrate comprising:

a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween; and said passivation film formed over said CMOS circuit.

62. A device according to claim 61, wherein said passivation film comprises silicon nitride.

63. A device according to claim 61, wherein said peripheral circuit comprises at least a shift register, an analog memory, an analog switch, and an analog buffer.

64. An active matrix device comprising:

a substrate having an insulating surface;

an active matrix circuit formed over said substrate, said active matrix circuit comprising:

a semiconductor layer formed over said substrate;

at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;

an interlayer insulating film formed over said first and second thin film transistors, said interlayer insulating film has at least one first contact hole;

a passivation film formed over said interlayer insulating film;

a second contact hole formed in said passivation film wherein said second contact hole is overlapped with said first contact hole and has a smaller diameter than said first contact hole; and a pixel electrode connected to said semiconductor layer via said second contact hole in said passivation film, a peripheral driving circuit formed over said substrate comprising:

a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween; and said passivation film formed over said CMOS circuit.

65. A device according to claim 64, wherein said interlayer insulating film comprises silicon oxide.

66. A device according to claim 65, wherein said passivation film comprises silicon nitride.

67. An active matrix device comprising:
- a substrate having an insulating surface;
- an active matrix circuit formed over said substrate, said active matrix circuit comprising:
  - a semiconductor layer formed over said substrate;
  - at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
  - a passivation film formed over said first and second thin film transistors, said passivation film having at least one contact hole;
  - a pixel electrode connected to one of said first and second thin film transistors, said pixel electrode being directly in contact with a portion of said semiconductor layer via said contact hole in said passivation film; and
  - a capacitor forming electrode formed between said semiconductor layer and pixel electrode,
- a peripheral driving circuit formed over said substrate comprising:
  - a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween, wherein said N-channel thin film transistor has a LDD structure; and
  - said passivation film formed over said CMOS circuit.

68. A device according to claim 67, wherein said passivation film comprises silicon nitride.

69. A device according to claim 67, wherein said peripheral circuit comprises at least a shift register, an analog memory, an analog switch, and an analog buffer.

70. An active matrix device comprising:
- a substrate having an insulating surface;
- an active matrix circuit formed over said substrate, said active matrix circuit comprising:
  - a semiconductor layer formed over said substrate;
  - at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
  - an interlayer insulating film formed over said first and second thin film transistors, said interlayer insulating film has at least one first contact hole;
  - a passivation film formed over said interlayer insulating film;
  - a second contact hole formed in said passivation film wherein said second contact hole is overlapped with said first contact hole and has a smaller diameter than said first contact hole; and
  - a pixel electrode connected to a portion of said semiconductor layer via said second contact hole in said passivation film,
- a peripheral driving circuit formed over said substrate comprising:
  - a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween, wherein said N-channel thin film transistor has a LDD structure; and
  - said passivation film formed over said CMOS circuit.

71. A device according to claim 70, wherein said interlayer insulating film comprises silicon oxide.

72. A device according to claim 70, wherein said passivation film comprises silicon nitride.

73. An active matrix device comprising:
- a substrate having an insulating surface;
- an active matrix circuit formed over said substrate, said active matrix circuit comprising:
  - a semiconductor layer formed over said substrate;
  - at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
  - a metal layer connected to one of said first and second thin film transistors;
  - a passivation film formed over said first and second thin film transistors and said metal layer, said passivation film having at least one contact hole;
  - a pixel electrode connected to the other one of said first and second thin film transistors, said pixel electrode being directly in contact with a portion of said semiconductor layer via said contact hole in said passivation film; and
  - a capacitor forming electrode formed between said semiconductor layer and pixel electrode,
- a peripheral driving circuit formed over said substrate comprising:
  - a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween; and
  - said passivation film formed over said CMOS circuit.

74. A device according to claim 73, wherein said passivation film comprises silicon nitride.

75. A device according to claim 73, wherein said peripheral circuit comprises at least a shift register, an analog memory, an analog switch, and an analog buffer.

76. An active matrix device comprising:
- a substrate having an insulating surface;
- an active matrix circuit formed over said substrate, said active matrix circuit comprising:
  - a semiconductor layer formed over said substrate;
  - at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;

an interlayer insulating film formed over said first and second thin film transistors, said interlayer insulating film has at least one first contact hole;

a metal layer connected to one of said first and second thin film transistors via said interlayer insulating film;

a passivation film formed over said interlayer insulating film and said metal layer;

a second contact hole formed in said passivation film wherein said second contact hole is overlapped with said first contact hole and has a smaller diameter than said first contact hole; and a pixel electrode connected to said semiconductor layer via said second contact hole in said passivation film, a peripheral driving circuit formed over said substrate comprising:

a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween; and said passivation film formed over said CMOS circuit.

77. A device according to claim 76, wherein said interlayer insulating film comprises silicon oxide.

78. A device according to claim 76, wherein said passivation film comprises silicon nitride.

79. An active matrix device comprising:
a substrate having an insulating surface;
an active matrix circuit formed over said substrate, said active matrix circuit comprising:
  a semiconductor layer formed over said substrate;
  at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween; and
  a pixel electrode connected to said semiconductor layer,
a peripheral driving circuit formed over said substrate comprising:
  a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween;
  a gate line connected to said gate electrode in said CMOS circuit;
  wirings formed over said CMOS circuit and said gate line; and
  a contact portion between said gate line and one of said wirings formed over said substrate.

80. A device according to claim 79, wherein said peripheral circuit comprises at least a shift register, an analog memory, an analog switch, and an analog buffer.

81. A device according to claim 79, wherein said source and drain regions in said P-channel thin film transistor in said peripheral circuit include boron and phosphorus.

82. An active matrix device comprising:
a substrate having an insulating surface;
an active matrix circuit formed over said substrate, said active matrix circuit comprising:
  a semiconductor layer formed over said substrate;
  at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween; and
  a pixel electrode connected to one of said first and second thin film transistors,
a peripheral driving circuit formed over said substrate comprising:
  a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween, wherein said N-channel thin film transistor has a LDD structure;
  a gate line connected to said gate electrode in said CMOS circuit;
  an interlayer insulating film formed over said CMOS circuit and said gate line;
  wirings formed over said interlayer insulating film; and
  a contact portion between said gate line and one of said wirings formed over said substrate via said interlayer insulating film.

83. A device according to claim 82, wherein said interlayer insulating film comprises silicon oxide.

84. A device according to claim 82, wherein said source and drain regions in said P-channel thin film transistor in said peripheral circuit include boron and phosphorus.

85. An active matrix device comprising:
a substrate having an insulating surface;
an active matrix circuit formed over said substrate, said active matrix circuit comprising:
  a semiconductor layer formed over said substrate;
  at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
  an interlayer insulating film formed over said first and second thin film transistors;
  a passivation film formed over said interlayer insulating film; and
  a pixel electrode connected to one of said first and second thin film transistors via said passivation film,
a peripheral driving circuit formed over said substrate comprising:
  a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween;

a gate line connected to said gate electrode in said CMOS circuit;

said interlayer insulating film formed over said CMOS circuit and said gate line;

wirings formed over said interlayer insulating film;

a contact portion formed over said substrate between said gate line and one of said wirings via said interlayer insulating film; and said passivation film formed over said CMOS circuit and said contact portion.

86. A device according to claim 85, wherein said interlayer insulating film comprises silicon oxide.

87. A device according to claim 85, wherein said passivation film comprises silicon nitride.

88. An active matrix device comprising:

a substrate having an insulating surface;

an active matrix circuit formed over said substrate, said active matrix circuit comprising:
- a semiconductor layer formed over said substrate;
- at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
- a pixel electrode connected to said semiconductor layer; and
- a capacitor forming electrode formed over said substrate and interposed between said a portion of said semiconductor layer and a portion of said pixel electrode, a peripheral driving circuit formed over said substrate comprising:
- a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween;
- a gate line connected to said gate electrode in said CMOS circuit;
- wirings formed over said CMOS circuit and said gate line; and
- a contact portion between said gate line and one of said wirings formed over said substrate.

89. A device according to claim 88, wherein said peripheral circuit comprises at least a shift register, an analog memory, an analog switch, and an analog buffer.

90. A device according to claim 88, wherein said source and drain regions in said P-channel thin film transistor in said peripheral circuit include boron and phosphorus.

91. An active matrix device comprising:

a substrate having an insulating surface;

an active matrix circuit formed over said substrate, said active matrix circuit comprising:
- a semiconductor layer formed over said substrate;
- at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
- a pixel electrode connected to one of said first and second thin film transistors; and
- a capacitor forming electrode formed over said substrate and interposed between said a portion of said semiconductor layer and a portion of said pixel electrode, a peripheral driving circuit formed over said substrate comprising:
- a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween, wherein said N-channel thin film transistor has a LDD structure;
- a gate line connected to said gate electrode in said CMOS circuit;
- an interlayer insulating film formed over said CMOS circuit and said gate line;
- wirings formed over said interlayer insulating film; and
- a contact portion between said gate line and one of said wirings formed over said substrate via said interlayer insulating film.

92. A device according to claim 91, wherein said interlayer insulating film comprises silicon oxide.

93. A device according to claim 91, wherein said source and drain regions in said P-channel thin film transistor in said peripheral circuit include boron and phosphorus.

94. An active matrix device comprising:

a substrate having an insulating surface;

an active matrix circuit formed over said substrate, said active matrix circuit comprising:
- a semiconductor layer formed over said substrate;
- at least first and second thin film transistors formed with said semiconductor layer, each of said first and second thin film transistors comprising at least a channel forming region and source and drain regions in said semiconductor layer and at least a gate electrode adjacent to said channel forming region with a gate insulating film interposed therebetween;
- an interlayer insulating film formed over said first and second thin film transistors;
- a passivation film formed over said interlayer insulating film;
- a pixel electrode connected to one of said first and second thin film transistors via said passivation film; and
- a capacitor forming electrode formed over said substrate and overlapping with said a portion of said semiconductor layer and a portion of said pixel electrode, a peripheral driving circuit formed over said substrate comprising:
- a CMOS circuit including an N-channel thin film transistor and a P-channel thin film transistor, each of said N-channel thin film transistor and said P-channel thin film transistor comprising said semiconductor layer having a channel forming region and source and drain regions, and a gate electrode adjacent to said channel forming region with a gate insulating film interposed therebetween;

a gate line connected to said gate electrode in said CMOS circuit;

said interlayer insulating film formed over said CMOS circuit and said gate line;

wirings formed over said interlayer insulating film;

a contact portion between said gate line and one of said wirings formed over said substrate via said interlayer insulating film; and said passivation film formed over said CMOS circuit and said contact portion.

95. A device according to claim 94, wherein said interlayer insulating film comprises silicon oxide.

96. A device according to claim 94, wherein said passivation film comprises silicon nitride.

* * * * *